US009137927B2

(12) United States Patent
Nakamura et al.

(10) Patent No.: US 9,137,927 B2
(45) Date of Patent: Sep. 15, 2015

(54) TELEVISION APPARATUS AND ELECTRONIC DEVICE

(71) Applicants:Kazuhiro Nakamura, Tokyo (JP); Mitsuhiro Murakami, Tokyo (JP); Masataka Tokoro, Tokyo (JP); Kohei Wada, Tokyo (JP); Toshikatsu Nakamura, Tokyo (JP)

(72) Inventors: Kazuhiro Nakamura, Tokyo (JP); Mitsuhiro Murakami, Tokyo (JP); Masataka Tokoro, Tokyo (JP); Kohei Wada, Tokyo (JP); Toshikatsu Nakamura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 344 days.

(21) Appl. No.: 13/713,701

(22) Filed: Dec. 13, 2012

(65) Prior Publication Data

US 2013/0100360 A1 Apr. 25, 2013

Related U.S. Application Data

(63) Continuation of application No. 13/069,017, filed on Mar. 22, 2011, now abandoned.

(30) Foreign Application Priority Data

Jun. 18, 2010 (JP) ................. 2010-139842

(51) Int. Cl.
*H04N 5/64* (2006.01)
*H05K 7/00* (2006.01)
*G02F 1/1333* (2006.01)
*H05K 7/20* (2006.01)
*G06F 1/20* (2006.01)

(52) U.S. Cl.
CPC ............... *H05K 7/2039* (2013.01); *G06F 1/20* (2013.01); *G06F 1/203* (2013.01); *H04N 5/64* (2013.01); *H05K 7/2099* (2013.01)

(58) Field of Classification Search
USPC .............. 348/836, 794; 361/679.21, 679.27, 361/679.28; 313/12; 349/58
See application file for complete search history.

(56) References Cited

U.S. PATENT DOCUMENTS

| 6,411,501 | B1 * | 6/2002 | Cho et al. ................. 361/679.27 |
| 6,477,039 | B2 * | 11/2002 | Tajima ..................... 361/679.21 |
| 7,522,231 | B2 * | 4/2009 | Cao ................................. 349/58 |
| 7,733,638 | B2 * | 6/2010 | Tanaka et al. ............ 361/679.28 |

(Continued)

FOREIGN PATENT DOCUMENTS

| JP | 2003-031743 | 1/2003 |
| JP | 2003-101272 | 4/2003 |

(Continued)

OTHER PUBLICATIONS

Japanese Patent Application No. 2010-139842, Notice of Rejection, mailed Jun. 21, 2011, (with English Translation).
U.S. Appl. No. 13/069,017, Non-Final Office Action, mailed Sep. 13, 2012.

*Primary Examiner* — Gims Philippe
(74) *Attorney, Agent, or Firm* — William W. Schaal; Rutan & Tucker, LLP

(57) ABSTRACT

According to one embodiment, a television apparatus includes: a substrate, a heat transport mechanism, and a pressing member. The television apparatus comprises a housing; a substrate situated in the housing and including a first component mounted thereon; a second component thermally coupled to the first component; and a pressing member. The pressing member comprises a wall portion configured to attach into an edge of the substrate, and to press the second component to contact the first component.

18 Claims, 12 Drawing Sheets

(56) References Cited

U.S. PATENT DOCUMENTS

| | | | |
|---|---|---|---|
| 2005/0117307 A1 | 6/2005 | Tanaka | |
| 2005/0280751 A1* | 12/2005 | Kim et al. | 349/58 |
| 2007/0146558 A1* | 6/2007 | Urisu | 348/794 |
| 2010/0007258 A1* | 1/2010 | Iwata et al. | 313/12 |
| 2011/0310313 A1 | 12/2011 | Nakamura et al. | |

FOREIGN PATENT DOCUMENTS

| | | |
|---|---|---|
| JP | 2003-283165 | 10/2003 |
| JP | 2005-166715 | 6/2005 |
| JP | 2008-035378 | 2/2008 |

* cited by examiner

TELEVISION APPARATUS AND ELECTRONIC DEVICE

CROSS-REFERENCE TO RELATED APPLICATIONS

This application is based upon and claims the benefit of priority of U.S. patent application Ser. No. 13/069,017, filed Mar. 22, 2011, now abandoned, and Japanese Patent Application No. 2010-139842, filed Jun. 18, 2010, the entire contents of which are incorporated herein by reference.

FIELD

Embodiments described herein relate generally to a television apparatus and an electronic device.

BACKGROUND

Typically, electronic devices are known in which a pressing member is fixed on a substrate and presses a heat receiving portion of a heat pipe or presses a heat releasing block thermally-linked to the heat receiving portion against an exothermic body.

With regard to such electronic devices, there is a demand for preventing the pressed state of components achieved by making use of the pressing member from undergoing variation.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

In general, according to one embodiment, a television apparatus comprises a substrate, a heat transport mechanism, and a pressing member. The substrate is housed in a housing, and has an exothermic component mounted thereon. The heat transport mechanism is at least partially housed inside the housing. The heat transport mechanism comprises a heat receiving portion, a heat releasing portion, and a heat transferring portion. The heat receiving portion is configured to receive heat from the exothermic component. The heat releasing portion is configured to release heat. The heat transferring portion is configured to house a medium for carrying heat from the heat receiving portion to the heat releasing portion. The pressing member comprises a plurality of portions-to-be-fixed, a pressing portion, a plurality of arm portions, and an engaging portion. The plurality of portions-to-be-fixed are fixed to the substrate. The pressing portion is configured to press the heat receiving portion or press a heat releasing block thermally-linked to the heat receiving portion against the exothermic body. The plurality of arm portions are disposed in between the portions-to-be-fixed and the pressing portion. The engaging portion is configured to engage with the substrate.

According to another embodiment, a television apparatus comprises a substrate, a pressing member, and an engaging portion. The substrate is housed in a housing, and has a component mounted or installed thereon. The pressing member is fixed on the substrate, and configured to press the component against the substrate. The engaging portion is formed in the pressing member, and configured to engage with an edge of the substrate.

According to still another embodiment, an electronic device comprises: a substrate, a heat transport mechanism, and a pressing member. The substrate is housed in a housing, and has an exothermic component mounted thereon. The heat transport mechanism is at least partially housed inside the housing. The heat transport mechanism comprises a heat receiving portion, a heat releasing portion, and a heat transferring portion. The heat receiving portion is configured to receive heat from the exothermic component. The heat releasing portion is configured to release heat. The heat transferring portion is configured to house a medium for carrying heat from the heat receiving portion to the heat releasing portion. The pressing member comprises a plurality of portions-to-be-fixed, a pressing portion, a plurality of arm portions, and an engaging portion. The plurality of portions-to-be-fixed are fixed to the substrate. The pressing portion is configured to press the heat receiving portion or press a heat releasing block thermally-linked to the heat receiving portion against the exothermic body. The plurality of arm portions are disposed in between the portions-to-be-fixed and the pressing portion. The engaging portion is configured to engage the pressing member with the substrate.

Figure 1:
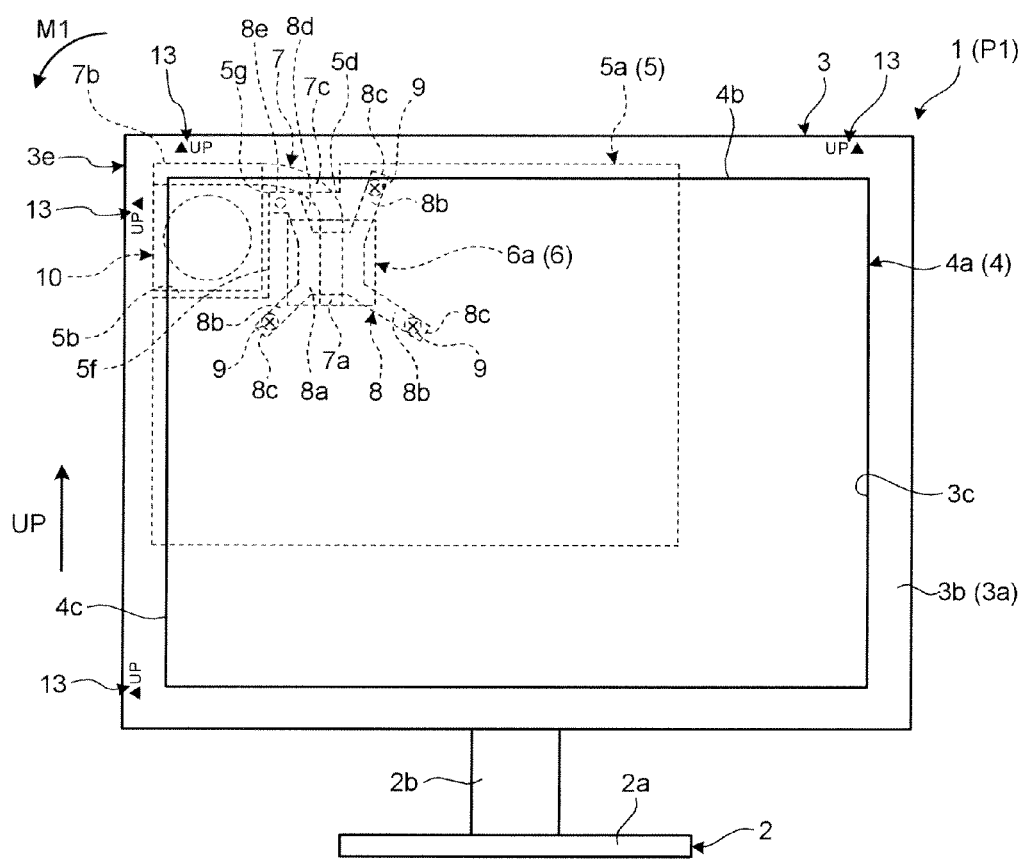
FIG. 1 is an exemplary front view of a first orientation of a television apparatus which is an electronic device according to a first embodiment.
Figure 2:
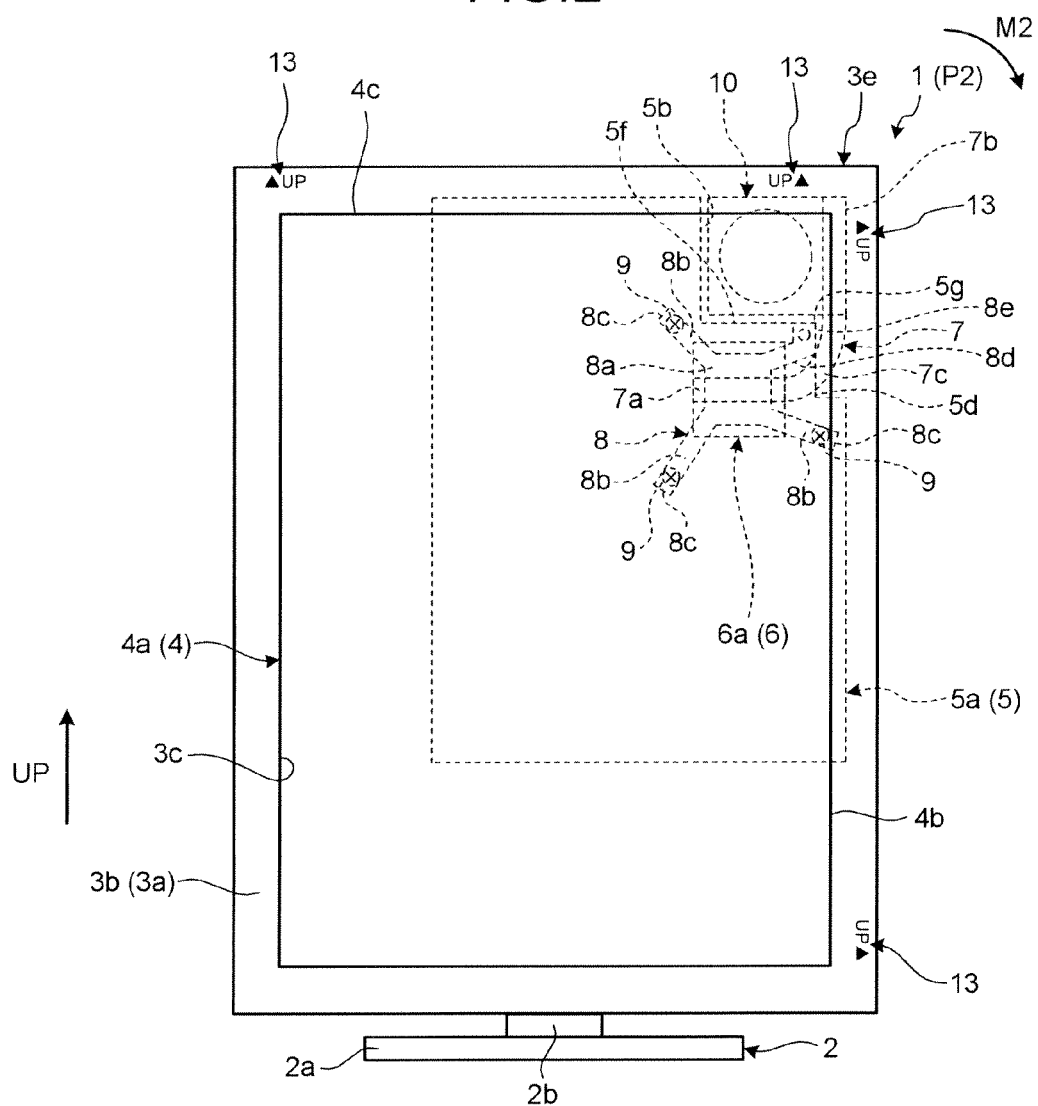
FIG. 2 is an exemplary front view of a second orientation of the television apparatus in the first embodiment.

As illustrated in FIGS. 1 and 2, according to a first embodiment, a television apparatus 1 that is an electronic device comprises a stand 2 and a main body 3 supported by the stand 2. Meanwhile, in FIGS. 1 and 2, "UP" represents the upper side in the operating state.

The stand 2 has a base 2a and a leg 2b that extends from the base 2a to the rear side of the central portion of the main body 3. To the fore-end (not illustrated) of the leg 2b, the tail end (rear end) (not illustrated) of a housing 3a of the main body 3 is rotatably supported via a hinge mechanism (not illustrated) made of, for example, ball joints or universal joints. The television apparatus 1 has what is called a pivot function, with which the television apparatus 1 can be used in a landscape-style first orientation P1 (FIG. 1) in which a side 4b of a display screen 4a is positioned on the upper side and can be used in a portrait-style second orientation P2 (FIG. 2) in which another side 4c of the display screen 4a is positioned on the upper side. On a front face 3b of the housing 3a is disposed a display element 13 for the purpose of displaying a symbol or a character representing the orientation (for example, the upper side) that is set at the time of use. That enables the user to recognize whether the first orientation P1 or the second orientation P2 is set.

The housing 3a of the main body 3 houses a display panel 4 (such as a liquid crystal display (LCD)) that is a display device (display) having the display screen 4a exposed anteriorly from an opening 3c formed on the front face 3b, and houses a substrate 5a having electronic components such as a central processing unit (CPU) 6 mounted thereon. The display panel 4 and the substrate 5a are fixed to the housing 3a with screws or the like (not illustrated). The substrate 5a and the electronic components (not illustrated) such as the CPU 6 mounted on the substrate 5a constitute a substrate assembly 5. Meanwhile, in FIGS. 1 and 2, the electronic components other than the CPU 6 are not illustrated.

The display panel 4 is formed in the shape of a thin and flat rectangular parallelepiped along the front-back direction (perpendicular direction to the plane of paper of FIG. 1). The display panel 4 receives picture signals from a picture signal processing circuit (not illustrated), which is one of the control circuits (not illustrated) configured with the electronic components mounted on the substrate 5a. Then, the display panel 4 displays stationary pictures or motion pictures on the display screen 4a that is positioned in the front. Apart from the picture signal processing circuit, the control circuits (not illustrated) in the television apparatus 1 comprises a tuner module, a high-definition multimedia interface (HDMI) signal processing module, an audio-video (AV) input terminal, a remote control signal receiving module, a control module, a selector, an on-screen display interface, a memory module (such as a read only memory (ROM), a random access memory (RAM), or a hard disk drive (HDD)), and an audio signal processing circuit. The substrate 5a (substrate assembly 5) is housed behind (on the rear side of) the display panel 4 inside the housing 3a. Meanwhile, the television apparatus 1 has built-in amplifiers or speakers (not illustrated) for the purpose of audio output.

As illustrated in FIGS. 1 and 2, the CPU 6 that is an exothermic electronic component is mounted on the substrate 5a. On die (not illustrated) of the CPU 6 is mounted a heat releasing block 6a, and on the heat releasing block 6a is mounted a heat receiving portion 7a of a heat pipe 7 that functions as a heat transport mechanism. The heat receiving portion 7a is pressed against the heat releasing block 6a with a pressing member 8, which is fixed to the substrate 5a using screws 9 as fastening members. In such a configuration, the heat generated by the exothermic CPU 6 is transported to the heat receiving portion 7a via the heat releasing block 6a.

The heat pipe 7 functioning as the heat transport mechanism is a pipe having, for example, an elongated flattened cross-section and is made of a metallic component (such as copper alloy) having relatively high heat conductivity. One end of that pipe constitutes the heat receiving portion 7a, while the other end thereof constitutes a heat releasing portion 7b. The portion in between the heat receiving portion 7a and the heat releasing portion 7b is a heat transferring portion 7c. On the outside of the heat releasing portion 7b are attached fins (not illustrated) that are made of thin sheets of a metallic component (such as copper alloy) having relatively high heat conductivity. Moreover, inside the housing 3a, at a position adjacent to the heat releasing portion 7b is installed a fan 10 that has a thin flat appearance in the thickness direction of the substrate 5a and that comprises a rotor (not illustrated) rotating around a rotary shaft positioned along a perpendicular direction to the front and rear faces of the substrate 5a. The rotor of the fan 10 is rotated using an electric motor so that, for example, the air that is taken in from the housing 3a through air inlets (not illustrated) formed on both sides of the axial direction of the rotary shaft (i.e., formed on the front side and on the rear side) is discharged through an exhaust outlet (not illustrated) formed opposite to the heat releasing portion 7b. That is, the flow of air discharged by the fan 10 reaches the heat releasing portion 7b and the fins, as a result of which the heat releasing portion 7b and the fins are subjected to cooling. Meanwhile, the fan 10 is fit in an L-shaped notch 5b formed at a corner of the substrate 5a.

Within the heat pipe 7 is enclosed a heat transport medium such as the alternative for chlorofluorocarbon having relatively high volatility. Inside the heat pipe 7, the heat transport medium at the heat receiving portion 7a first evaporates into gas due to the heat generated by the CPU 6, then reaches the heat releasing portion 7b in the gaseous state via the heat transferring portion 7c, and then condenses to liquid by getting cooled at the heat releasing portion 7b. The heat transport medium in the liquid state returns from the heat releasing portion 7b to the heat receiving portion 7a via the heat transferring portion 7c, and evaporates into gas at the heat receiving portion 7a. Thus, the heat transport medium absorbs latent heat at the heat receiving portion 7a and releases that latent heat at the heat releasing portion 7b. As a result, the heat gets transported from the heat receiving portion 7a to the heat releasing portion 7b. That is, the heat generated by the exothermic CPU 6 is transported to the heat releasing portion 7b via the heat receiving portion 7a and the heat transferring portion 7c (through the heat transport medium flowing therein) and is then transferred from the heat releasing portion 7b into the flow of air, which is then discharged to the outside of the housing 3a through an exhaust outlet 3d formed therein.

As can be seen in FIGS. 1 and 2 according to the present embodiment, in the first orientation P1 (FIG. 1) as well as in the second orientation P2 (FIG. 2), the heat receiving portion 7a is positioned on the lower side of the heat releasing portion 7b. In the heat pipe 7 functioning as the heat transport mechanism, in case the heat receiving portion 7a is positioned on the upper side of the heat releasing portion 7b thereby forming what is called a top heat condition, the heat transport medium in the liquid state does not easily return to the heat receiving portion 7a from the heat releasing portion 7b. That causes a decline in the heat transport efficiency, that is, in the heat releasing efficiency. Thus, in the present embodiment, the heat receiving portion 7a is positioned on the lower side of the heat releasing portion 7b in both of the first orientation P1 (FIG. 1) and the second orientation P2 (FIG. 2) that are defined to be the correct orientations. Hence, it becomes possible to prevent the heat transport efficiency, that is, the heat releasing efficiency from declining.

Moreover, in the present embodiment, the heat releasing portion 7b is disposed at a corner 3e that lies at the upper end of the housing 3a in the first orientation P1 (FIG. 1) and in the second orientation P2 (FIG. 2). Since the heat is prone to rise inside the housing 3a due to the air current; disposing the heat releasing portion 7b at the corner 3e, which lies at the upper end of the housing 3a in both of the first orientation P1 and in the second orientation P2, makes it possible to prevent heat accumulation from occurring inside the housing 3a.

The pressing member 8 has a pressing portion 8a and a plurality of first arm portions 8b. The pressing portion 8a is formed into a substantially rectangular plate and is mounted above the heat releasing block 6a, which is mounted on the CPU 6, and installed above the heat receiving portion 7a of the heat pipe 7, which is mounted on the CPU 6. The first arm portions 8b are formed in a strip-like manner and extend outward in three different directions (in FIG. 1, in the upper-right direction, the lower-left direction, and the lower-right direction). Besides, each first arm portion 8b also extends upward while extending outward from the pressing portion 8a. At the fore-end of each first arm portion 8b is disposed a bracket 8c, which is a portion-to-be-fixed that is fixed to the substrate 5a. In order to fix the pressing member 8 to the substrate 5a, the screws 9 that are fastening members are passed through the through holes formed on the brackets 8c and screwed into the stand (not illustrated) that represents a portion-to-be-fixed. Each bracket 8c is either fixed to a stand (not illustrated) protruding from the substrate 5a or flexes downward to form a droop portion (a vertical wall portion, not illustrated) facing the surface of the substrate 5a. Consequently, the fore-end side (outer side) of each first arm portion 8b lies higher than the base end side (inner side) thereof, which helps in increasing the pressing force exerted by the first arm portions 8b against the pressing portion 8a and, by extension, helps in increasing the pressing force exerted by the pressing member 8 against the pressing target of the heat releasing block 6a or the heat pipe 7.

Figure 3:
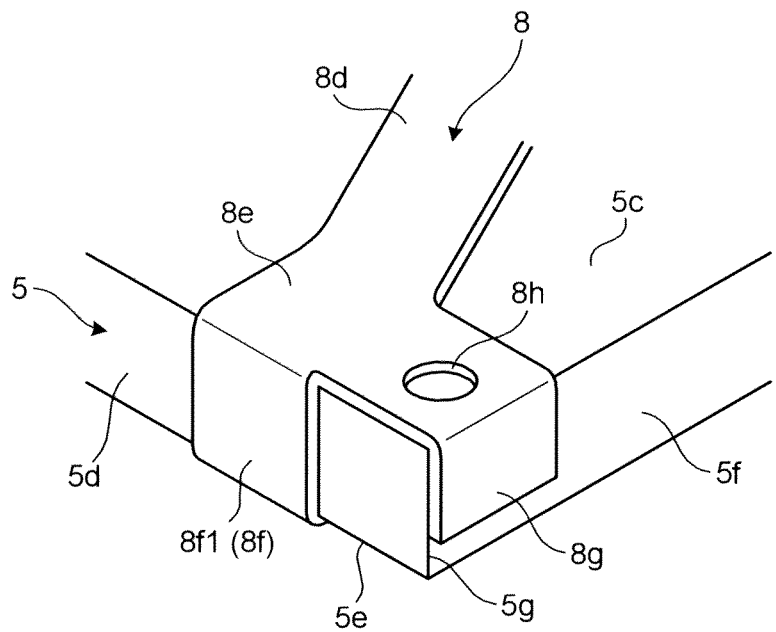
FIG. 3 is an exemplary front perspective view of a portion of a substrate disposed in the television apparatus in the first embodiment.

Besides, in the present embodiment, the pressing member 8 also has a second arm portion 8d, which is formed in a strip-like manner and which extends outward (in FIG. 1, in the upper-left direction). In the present embodiment, the second arm portion 8d extends almost parallel to a front face 5c that is the front side face of the substrate 5a. As illustrated in FIG. 3, at the fore-end of the second arm portion 8d is formed a contact portion 8e that makes contact with that portion on the front face 5c of the substrate 5a which is positioned on the upper side in the first orientation P1. The contact portion 8e has two engaging claws 8f and 8g (see FIGS. 3 and 4), which correspond to engaging portions in the present embodiment. Meanwhile, the front face 5c of the substrate 5a serves as the mounting face for the CPU 6 that is an exothermic component and also serves as the face on that side of the substrate 5a on which the pressing member 8 is mounted.

The engaging claw 8f has a first wall portion 8f/1 that, in the first orientation P1 of the main body 3, protrudes from the top edge of the contact portion 8e along an edge (lateral side) 5d that becomes the upper side of the substrate 5a in the first orientation P1, and has a second wall portion 8f/2 that protrudes from the tip of the first wall portion 8f/1 along a rear face (surface) 5e of the substrate 5a. Thus, the contact portion 8e, the first wall portion 8f/1, and the second wall portion 8f/2 present a hook-like appearance, and, in the first orientation P1 of the main body 3, hook from above into the edge 5d that is the upper side of the substrate 5a. Consequently, the first wall portion 8f/1 restricts the pressing member 8 from moving downward with respect to the substrate 5a in the first orientation P1 of the main body 3; while the second wall portion 8f/2 restricts the pressing member 8 from moving along the normal direction of the front face 5c of the substrate 5a. In the present embodiment, the first wall portion 8f/1 corresponds to a first engaging portion and the second wall portion 8f/2 corresponds to a second engaging portion.

The engaging claw 8g is configured as a wall portion that, in the second orientation P2 of the main body 3, protrudes from the top edge of the contact portion 8e along an edge (lateral side) 5f that is the upper side of the substrate 5a. Thus, in the second orientation P2 of the main body 3, the engaging claw 8g restricts the pressing member 8 from moving downward with respect to the substrate 5a. In the present embodiment, the engaging claw 8g also corresponds to a first engaging portion.

In this way, in the present embodiment, the pressing member 8 has the first wall portion 8f/1, the second wall portion 8f/2, and the engaging claw 8g that represent the plurality of engaging portions having different engaging directions. For that reason, when the pressing member 8 is used in an electronic device such as the television apparatus 1 in which the main body 3 can have different orientations, it becomes possible to prevent misalignment of the pressing member 8 from a predetermined position or prevent deformation of the pressing member 8 that can occur due to the external force, the gravitation force, or the inertia force acting thereon. More particularly, in the present embodiment, the first wall portion 8f/1 restricts the pressing member 8 from moving downward in the first orientation P1; while the engaging claw 8g restricts the pressing member 8 from moving downward in the second orientation P2. Moreover, the second wall portion 8f/2 restricts the pressing member 8 from moving away from the front face 5c of the substrate 5a.

As described above, in the present embodiment, the pressing member 8 presses the heat receiving portion 7a of the heat pipe 7 against the heat releasing block 6a or the CPU 6. Usually, the heat releasing portion 7a constitutes one end of the heat pipe 7 and fins (not illustrated) are soldered at the heat releasing portion 7b on the other end of the heat pipe 7. Thus, the pressing portion 8a of the pressing member 8 supports the heat pipe 7 in a cantilever manner at one end (at the heat releasing portion 7a) in the longitudinal direction, and the gravitational force or the inertia force acting on the heat pipe 7 acts as the external force on the pressing portion 8a. In the present embodiment, the external force from the heat pipe 7 acts as a rotational moment (torque) on the pressing portion 8a. In the direction along the front face 5c of the substrate 5a (i.e., in the in-plane direction), the gravitation force acting on the fins and the heat pipe 7 in the first orientation P1 (FIG. 1) of the main body 3 causes a rotational moment (M1) in the counterclockwise direction with reference to FIG. 1. With respect to the counterclockwise rotational moment, the first wall portion 8f/1 functions as the first engaging portion and restricts the movement of the pressing member 8 caused due to that rotational moment. In the second orientation P2 (FIG. 2) of the main body 3, the gravitation force acting on the fins and the heat pipe 7 causes a rotational moment (M2) in the clockwise direction with reference to FIG. 1. With respect to the clockwise rotational moment, the engaging claw 8g functions as the first engaging portion and restricts the movement of the pressing member 8 caused due to that rotational moment. Meanwhile, in the direction crossing the front face 5c of the substrate 5a (i.e., in the out-of-plane direction), the gravitation force acting on the fins and the heat pipe 7 in the first orientation P1 (FIG. 1) and the second orientation P2 (FIG. 2) of the main body 3 causes a rotational moment in the direction in which the upper part of the pressing member 8 tilts forward and away from the front face 5c of the substrate 5a. With respect to that rotational moment, the second wall portion 8f2 functions as the second engaging portion and restricts the movement of the pressing member 8 caused due to that rotational moment. Because of the second wall portion 8f2, the contact area between the heat receiving portion 7a and the heat releasing block 6a (CPU 6) can be prevented from decreasing and, by extension, the heat transport efficiency (i.e., the heat releasing efficiency) can be prevented from declining. In this way, the engaging claws 8f and 8g restrict the pressing member 8 from rotating.

Moreover, in the present embodiment, each of the first wall portion 8f1, the second wall portion 8f2, and the engaging claw 8g engages at the rim portions of the substrate 5a. That eliminates the need to from through holes in the substrate 5a. Hence, a simpler structure can be configured for the purpose of engagement with the substrate 5a.

Figure 4:
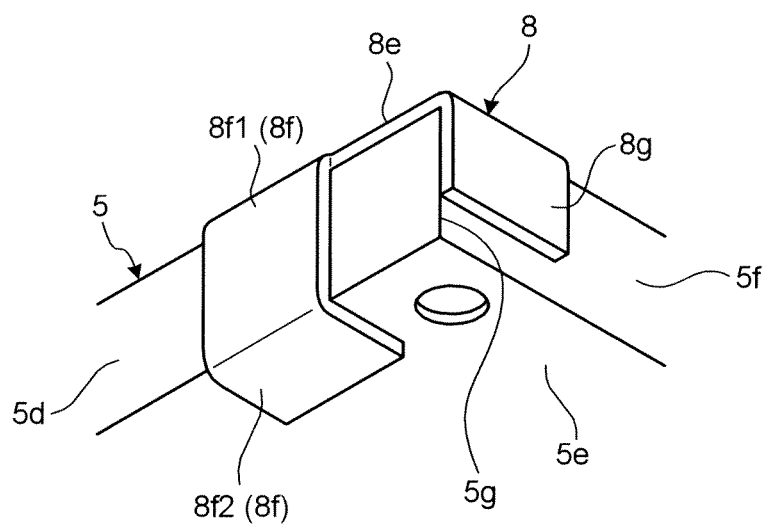
FIG. 4 is an exemplary rear perspective view of a portion of a substrate disposed in the television apparatus in the first embodiment.

Furthermore, in the present embodiment, as illustrated in FIGS. 3 and 4; the first wall portion 8f1, the second wall portion 8f2, and the engaging claw 8g engage at a corner 5g of the substrate 5a. For that reason, it becomes easier to collectively dispose the first wall portion 8f1, the second wall portion 8f2, and the engaging claw 8g, each of which engages in a different direction. Hence, the pressing member 8 having a plurality of engaging portions can be configured in a more compact manner.

Particularly, in the present embodiment, the first wall portion 8f1 and the engaging claw 8g engage at edges 5d and 5f, respectively, which are the two rim portions linked to the corner 5g. Hence, the portion including the first wall portion 8f1 and the engaging claw 8g can be configured in a more compact manner.

Moreover, in the present embodiment, a through hole 8h is formed in the contact portion 8e, which serves as the base on which the first wall portion 8f1, the second wall portion 8f2, and the engaging claw 8g are disposed. Through the through hole 8h is passed a screw (not illustrated) that is used to fit the pressing member 8 on the substrate 5a or used to fix the substrate 5a to the housing 3a of the main body 3. Thus, the contact portion 8e corresponds to a portion-to-be-fixed that is fixed to the substrate 5a. In such a configuration, the engaging portions, namely, the first wall portion 8f1, the second wall portion 8f2, and the engaging claw 8g can be configured in a more compact manner as compared to the case when those engaging portions are disposed at some other position on the pressing member 8. Moreover, since the rim portions or the corner 5g of the substrate 5a do not usually have any circuits designed thereon, it is easier to use those portions for fixing the pressing member 8 to the substrate 5a. Hence, as described in the present embodiment, by positioning the contact portion 8e on the rim portions or on the corner 5g of the substrate 5a and by using the contact portion 8e as the portion-to-be-fixed for the purpose of fixing the pressing member 8 to the substrate 5a, it becomes possible to achieve engagement of the pressing member 8 with the substrate 5a as well as to prevent the implementation efficiency of circuits from declining with a relatively simple configuration.

Figure 5:
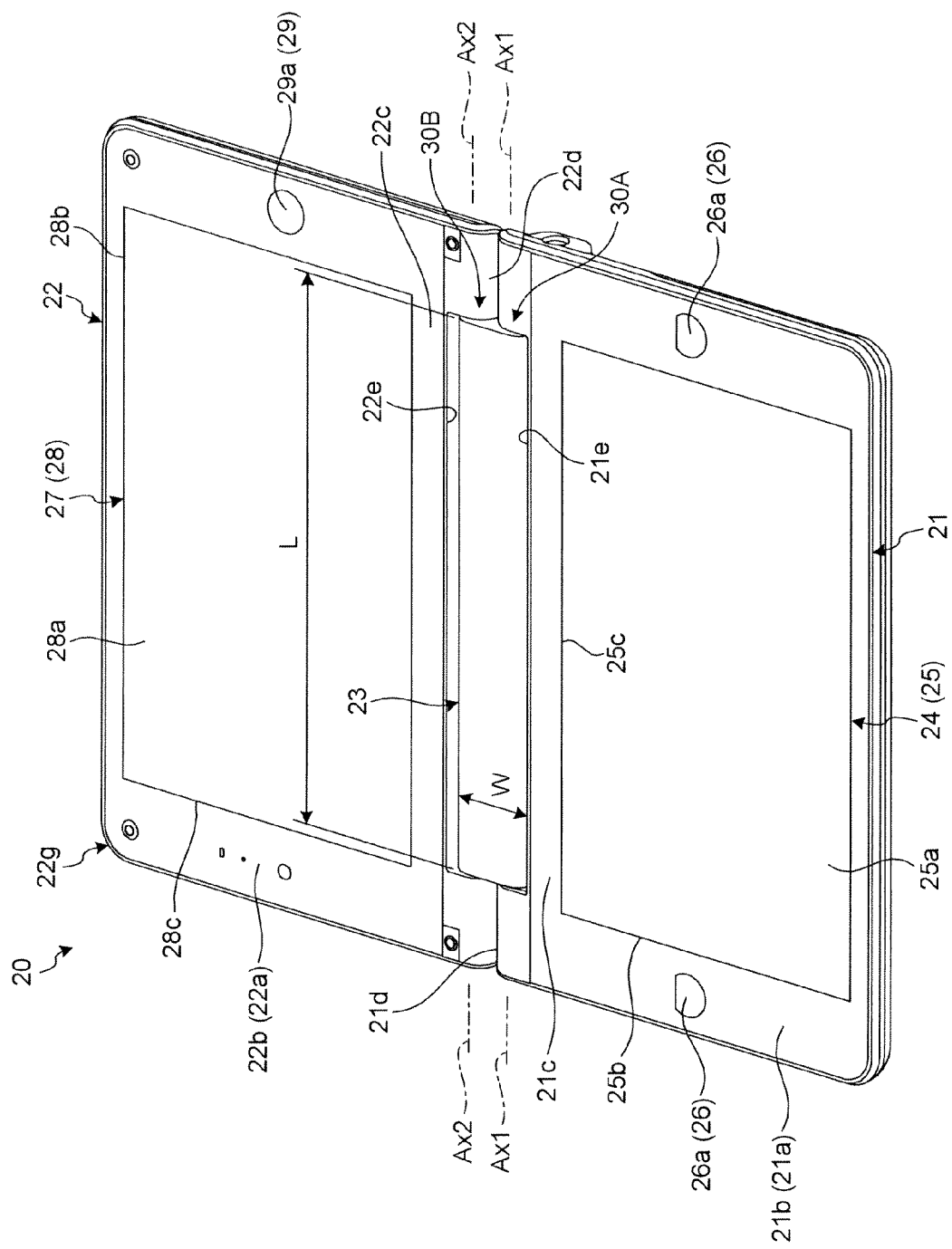
FIG. 5 is an exemplary perspective view of an open state of a personal computer which is an electronic device according to a second embodiment.

According to a second embodiment, a notebook-sized personal computer 20 functioning as an electronic device comprises a rectangular and flat first main body 21 and a rectangular and flat second main body 22 as illustrated in FIG. 5. The first main body 21 and the second main body 22 are connected in a relatively rotatable manner via a joint 23.

In the first main body 21, a display panel 25 such as an LCD, which is a display device having a touch panel 24 on the front face (i.e., on a display screen 25a), and a push button mechanism 26 are arranged in an exposed manner on a front face 21b that is the external face of a housing 21a. Similarly, in the second main body 22, a display panel 28 such as an LCD, which is a display device having a touch panel 27 on the front face (i.e., on a display screen 28a), and a push button mechanism 29 are arranged in an exposed manner on a front face 22b that is the external face of a housing 22a.

In the open state illustrated in FIG. 5, the display panel 25 and cover bodies 26a of the push button mechanism 26 as well as the display panel 28 and a cover body 29a of the push button mechanism 29 lie in an exposed condition. In such a state, the user is able to perform operations. In contrast, in a folded state (not illustrated), the front faces 21b and 22b face each other from up close in such a way that the display panel 25 and the cover bodies 26a of the push button mechanism 26 are hidden by the housing 21a; while the display panel 28 and the cover body 29a of the push button mechanism 29 are hidden by the housing 22a. In the present embodiment, the touch panels 24 and 27, the push button mechanisms 26 and 29, and a microphone (not illustrated) function as input operation modules; while the display panels 25 and 28 and speakers (not illustrated) function as output operation modules. Meanwhile, in a personal computer having a keyboard, or click buttons, or a pointing device (not illustrated); the keyboard or the click buttons also function as input operation modules.

The joint 23 connects the first main body 21 with the second main body 22, and is configured separately from the first main body 21 and the second main body 22. The joint 23 connects an end portion 21c at the base end of the first main body 21 with an end portion 22c at the base end of the second main body 22. At the central part in the longitudinal direction of an end edge 21d of the end portion 21c and at the central part in the longitudinal direction of an end edge 22d of the end portion 22c, respectively; rectangular notches 21e and 22e are formed except over the respective ends. Each of the rectangular notches 21e and 22e has a long opening along the longitudinal direction and has only a shallow depth. Half of the joint 23 is inserted in the notch 21e and the remaining half thereof is inserted in the notch 22e. A length L of the joint 23 is set to be slightly shorter than the width of the notches 21e and 22e. Moreover, a width W of the joint 23 is set to be substantially equal to the thickness when the first main body 21 and the second main body 22 are closed together in the folded state.

The first main body 21 and the joint 23 are connected in a relatively rotatable manner around a rotation axis Ax1 via a first hinge mechanism 30A. Similarly, the second main body 22 and the joint 23 are connected in a relatively rotatable manner around a rotation axis Ax2 via a second hinge mechanism 30B. The rotary shafts Ax1 and Ax2 lie parallel to each other. In the present embodiment, the first hinge mechanism 30A and the second hinge mechanism 30B are coupled together so that the relative rotation angle around the rotation axis Ax1 of the first main body 21 with respect to the joint 23 is identical to the relative rotation angle around the rotation axis Ax2 of the second main body 22 with respect to the joint 23. However, the two relative rotation directions with respect to the joint 23 are opposite to each other. Thus, when the user operates the joint 23 for the purpose of opening either one of the first main body 21 and the second main body 22, the personal computer 20 falls into the open state. Similarly, when the joint 23 is operated for the purpose of closing either one of the first main body 21 and the second main body 22, the personal computer 20 falls into the folded state. Moreover, when the user opens the first main body 21 and the second main body 22, the personal computer 20 falls into the open state. Similarly, when the first main body 21 and the second main body 22 are closed, the personal computer 20 falls into the folded state.

Figure 6:
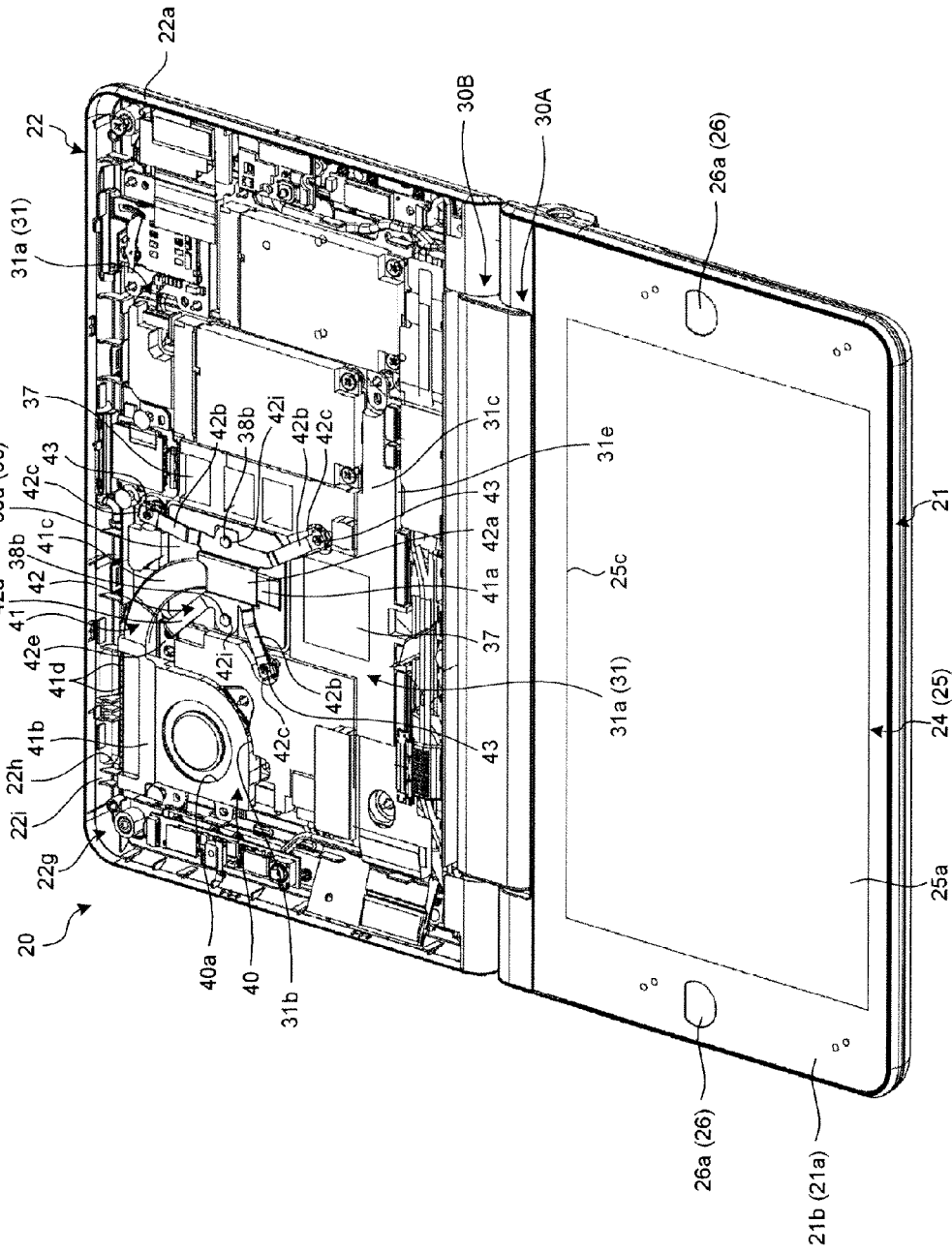
FIG. 6 is an exemplary perspective view of a second main body of FIG. 5 without a display panel, in the second embodiment.
Figure 7:
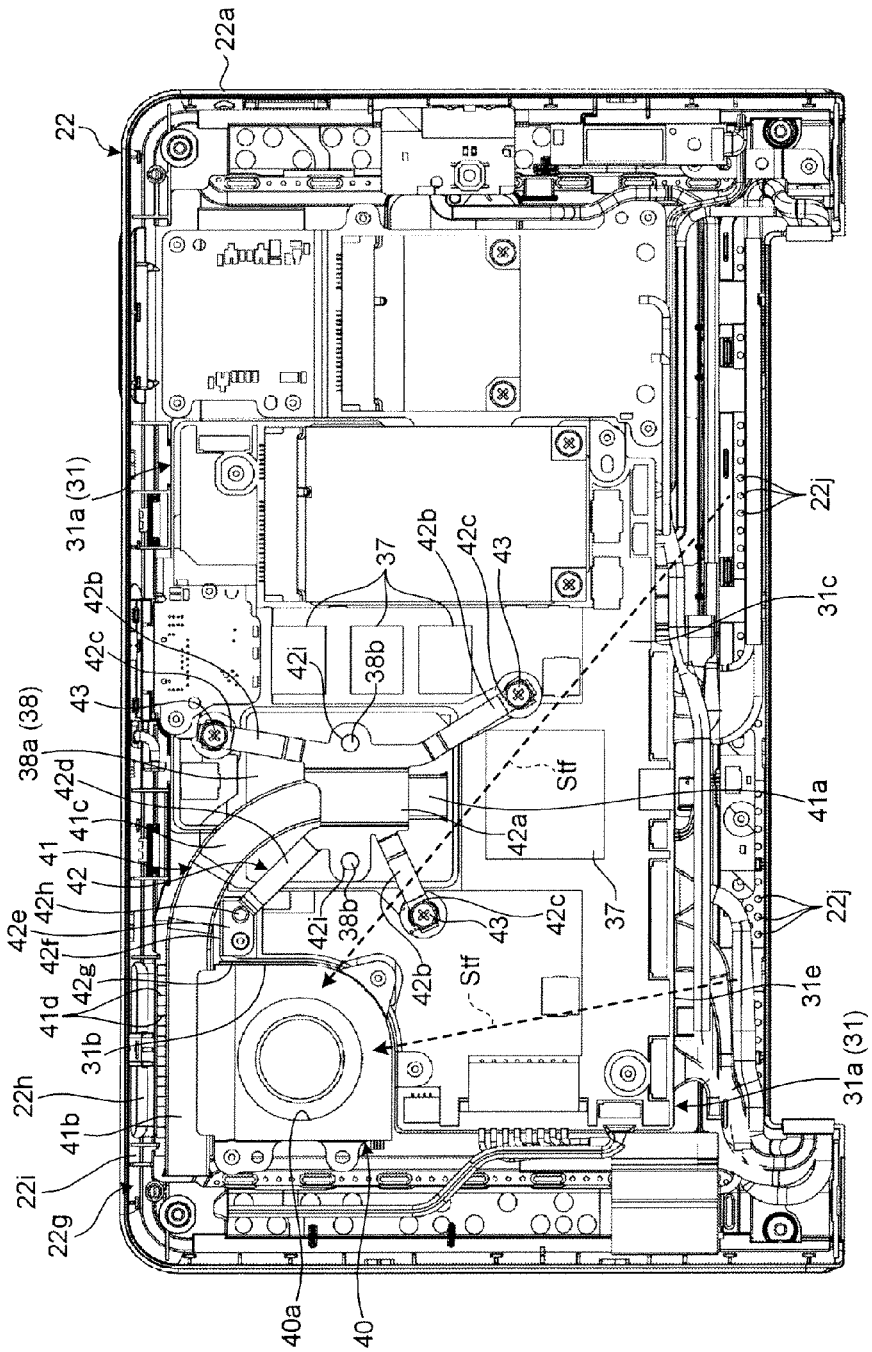
FIG. 7 is an exemplary front view of the second main body of the personal computer without the display panel, in the second embodiment.
Figure 8:
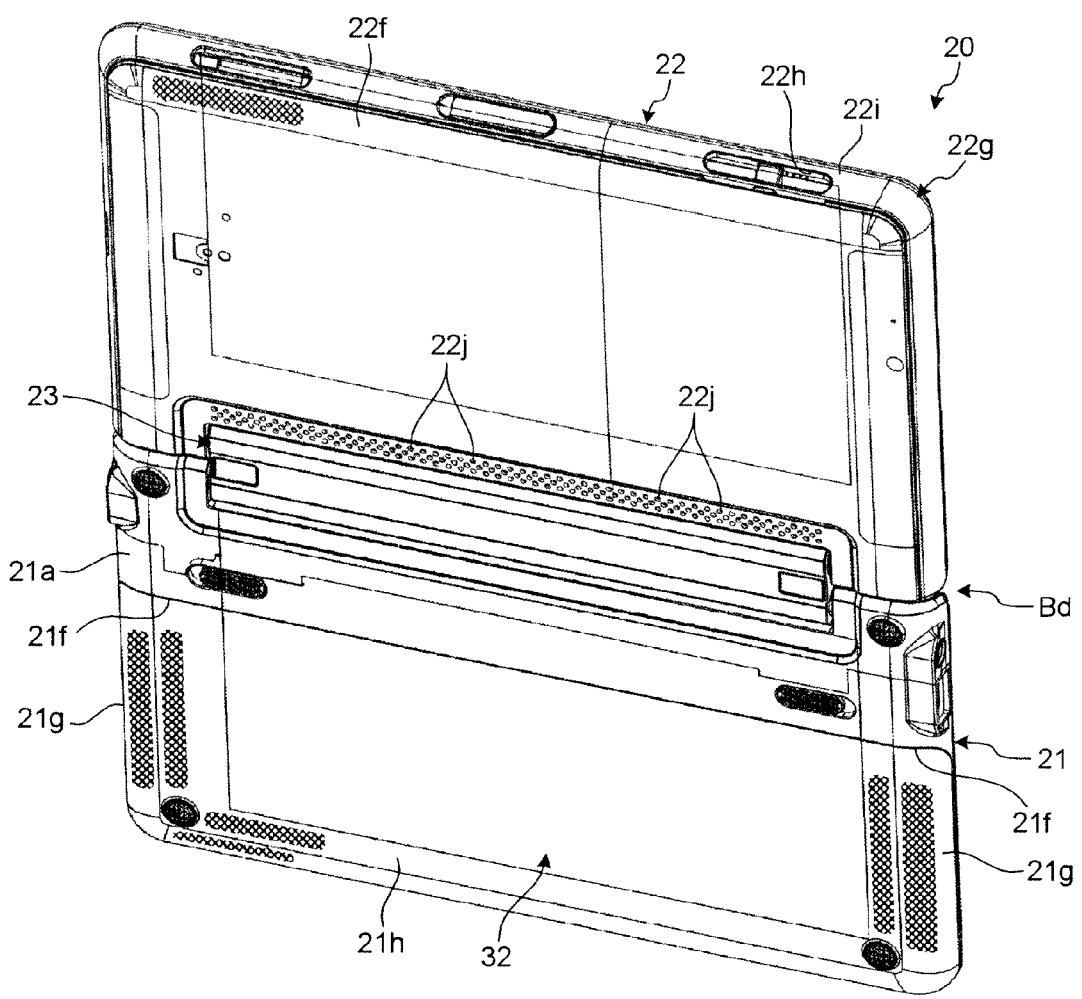
FIG. 8 is an exemplary rear perspective view illustrating the open state of the personal computer in the second embodiment.

In the present embodiment, as illustrated in FIGS. 6 and 7, a substrate 31a (a substrate assembly 31) with at least some of the control circuits including electronic components 37 mounted thereon is disposed, for example, inside the housing 22a of the second main body 22. In the housing 22a, the display panel 28 and the substrate 31a are fixed with screws or the like (not illustrated). Meanwhile, as illustrated in FIG. 8, in the first main body 21, a battery 32 is disposed as a power supply behind (on the rear side of) the display panel 25. On the rear side of the first main body 21, a depressed portion 21f is formed that is rectangular in appearance when viewed from the back. The depressed portion 21f gets covered by the battery 32 when the battery 32 is detachably attached to the housing 21a of the first main body 21. Thus, in the present embodiment, the substrate 31a (the substrate assembly 31) with the main electronic components such as a CPU 38 mounted thereon is disposed in the second main body 22, while the battery 32 is disposed in the first main body 21. In case the substrate assembly 31 and the battery 32 are disposed together in either one of the first main body 21 and the second main body 22, then following inconveniences are more likely to occur. For example, the thickness of the main bodies increases or, if there is a restriction on the thickness, then it becomes necessary to reduce the size and eventually the capacity of the battery 32. In contrast, in the present embodiment, the substrate assembly 31 and the battery 32 are separately disposed in the second main body 22 and the first main body 21, respectively. That makes it possible to avoid the abovementioned inconveniences. In this regard, however, in a first usage pattern U1 illustrated in FIG. 9; the first main body 21 is larger in mass than the second main body 22 so that the personal computer 20 can be stably placed on a desk or the like. In the present embodiment, the first main body 21 corresponds to a different main body that is connected to the second main body 22, which houses the substrate assembly 31, in a relatively rotatable manner via the hinge mechanisms 30A and 30B. Moreover, the display screen 25a of the display panel 25 in the first main body 21 corresponds to a different display screen.

Figure 9:
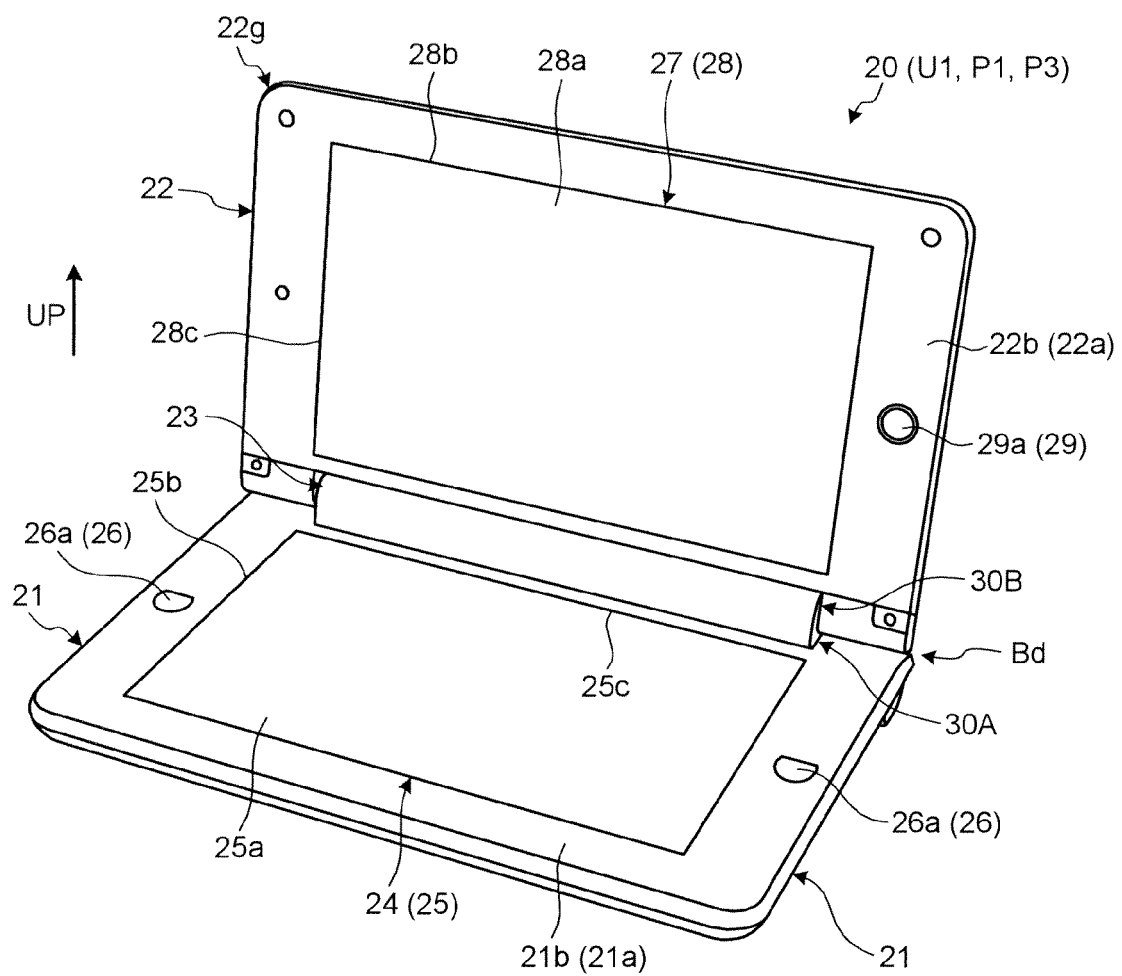
FIG. 9 is an exemplary perspective view illustrating a first usage pattern of the personal computer in the second embodiment.
Figure 10:
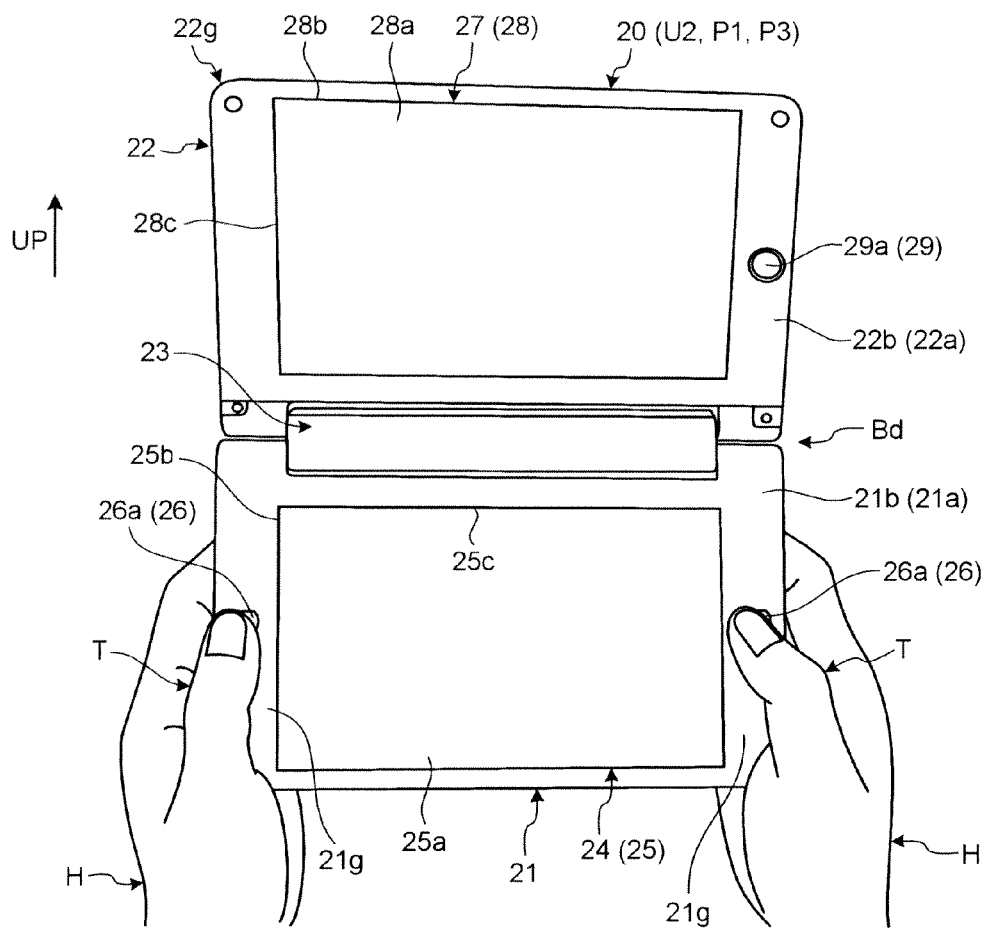
FIG. 10 is an exemplary perspective view illustrating a second usage pattern of the personal computer in the second embodiment.
Figure 11:
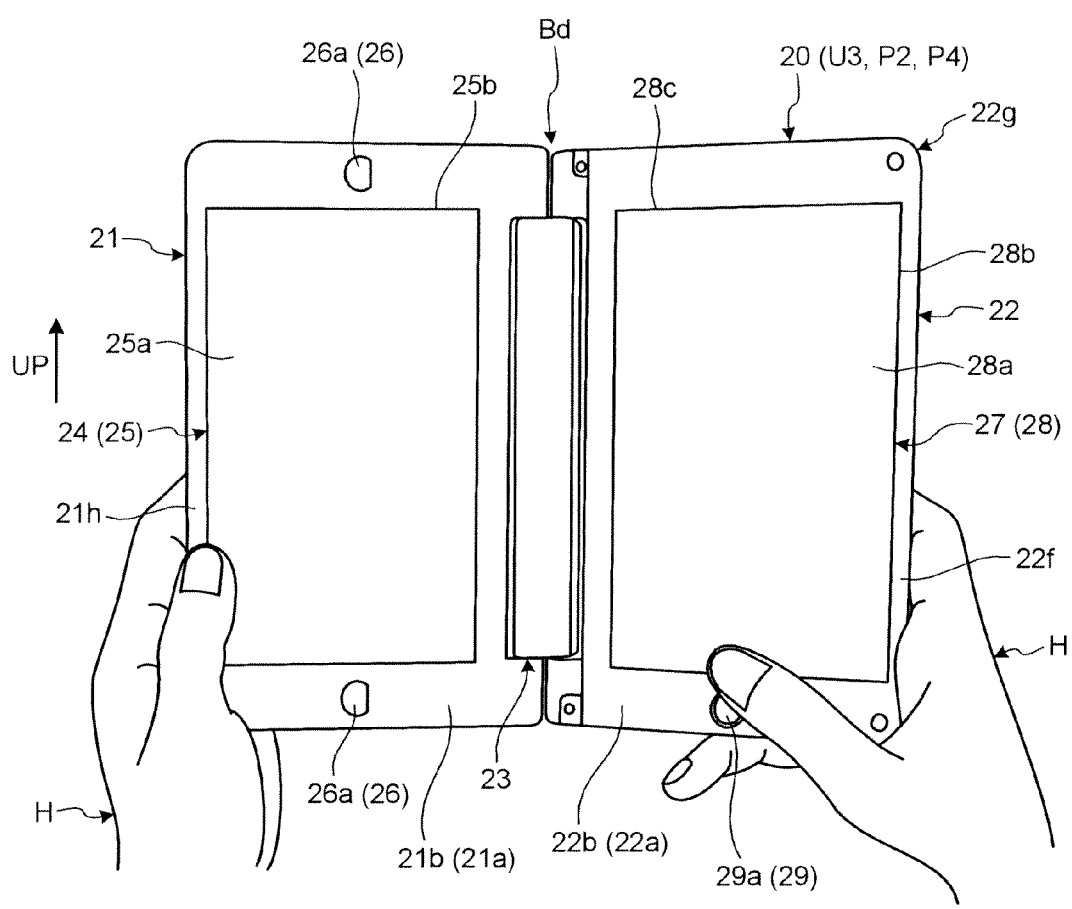
FIG. 11 is an exemplary perspective view illustrating a third usage pattern of the personal computer in the second embodiment.

Apart from the first usage pattern illustrated in FIG. 9, the personal computer 20 according to the present embodiment can be used in a second usage pattern U2 illustrated in FIG. 10 as well as in a third usage pattern U3 illustrated in FIG. 11. As illustrated in FIG. 10, the second usage pattern U2 is such that the first main body 21 and the second main body 22 are unfolded relatively widely, and a margin portion 21g on both sides in the width direction of the first main body 21 is held with hands H. In this second usage pattern U2, the user holding the first main body 21 with the hands H can operate the push button mechanism 26 with thumbs T. As illustrated in FIG. 11, the third usage pattern U3 is such that the first main body 21 and the second main body 22 are unfolded relatively widely, and a margin portion 21h on one side in the width direction of the first main body 21 and a margin portion 22f on one side in the width direction of the second main body 22 are held with the hands H. Herein, as far as the view of the user is concerned, the second usage pattern U2 is identical to the first usage pattern U1. However, as opposed to placing the personal computer 20 on a desk in the first usage pattern U1, the second usage pattern U2 is such that the personal computer 20 is held with the hands H while standing or sitting. Regarding the third usage pattern U3, the orientation of the display screens 25a and 28a of the display panels 25 and 28, respectively, is different by about 90° as compared to the orientation in the first usage pattern U1 and the second usage pattern U2.

Thus, the personal computer 20 according to the present embodiment can be used in the first orientation P1 (i.e., in the first usage pattern U1 and the second usage pattern U2, see FIGS. 9 and 10) in which a side 28b of the display screen 28a of the display panel 28 is positioned on the upper side and can be used in the second orientation P2 (i.e., in the third usage pattern U3, see FIG. 11) in which another side 28b of the display screen 28a of the display panel 28 as well as a side 25b of the display screen 25a of the display panel 25 are positioned on the upper side. The side 28b of the display screen 28a is distantly positioned from a boundary Bd between the first main body 21 and the second main body 22; while another side 28c of the display screen 28a and the side 25b of the display screen 25a are positioned to face each other across the boundary Bd. In the present embodiment, the first orientation P1 for the two display screen 28a also represents a third orientation P3 for the display screens 28a and 25a; while the second orientation P2 for the display screen 28a also represents a fourth orientation P4 for the two display screens 28a and 25a.

Herein, each of the display panels 25 and 28 is formed in the shape of a flat rectangular parallelepiped, and receives display signals from control circuits (not illustrated) configured with the electronic components mounted on the substrate 31a. Moreover, each of the display panels 25 and 28 displays stationary pictures or motion pictures. In the present embodiment, the light that represents the pictures displayed on the display screens 25a and 28a of the display panels 25 and 28, respectively, is output anteriorly via the display panels 25 and 28, respectively, which are colorless and transparent in nature. The control circuits in the personal computer 20 include a control module, a memory module (such as a ROM, a RAM, or an HDD), an interface circuit, and various controllers. Meanwhile, the personal computer 20 also has built-in speakers (not illustrated) for the purpose of audio output.

As illustrated in FIGS. 6 and 7, the CPU 38 that is an exothermic electronic component is mounted on the substrate 31a. On the die (not illustrated) of the CPU 38 is mounted a heat releasing block 38a, and on the heat releasing block 38a is mounted a heat receiving portion 41a of a heat pipe 41 that functions as a heat transport mechanism. The heat receiving portion 41a is pressed against the heat releasing block 38a with a pressing member 42, which is fixed to the substrate 31a using a screw 43 that is a fastening member. In such a configuration, the heat generated by the exothermic CPU 38 is transported to the heat receiving portion 41a via the heat releasing block 38a.

The heat pipe 41 functioning as the heat transport mechanism is a pipe having, for example, an elongated flattened cross-section and is made of a metallic component (such as copper alloy) having relatively high heat conductivity. One end of that pipe constitutes the heat receiving portion 41a, while the other end thereof constitutes a heat releasing portion 41b. The portion in between the heat receiving portion 41a and the heat releasing portion 41b is a heat transferring portion 41c. On the outside of the heat releasing portion 41b are attached a plurality of fins 41d that are made of thin sheets of a metallic component (such as copper alloy) having relatively high heat conductivity. Moreover, inside the housing 22a, at a position adjacent to the heat releasing portion 41b is installed a fan 40 that has a thin flat appearance in the thickness direction of the substrate 31a and that comprises a rotor (not illustrated) rotating around a rotary shaft positioned along the perpendicular direction to the front and rear sides of the substrate 31a. The rotor of the fan 40 is rotated using an electric motor so that, for example, the air that is taken in from the housing 22a through air inlets (not illustrated) formed on both sides of the axial direction of the rotary shaft (i.e., formed on the front side and on the rear side) is discharged through an exhaust outlet (not illustrated) formed opposite to the heat releasing portion 41b. That is, the flow of air discharged by the fan 40 reaches the heat releasing portion 41b and the fins 41d, as a result of which the heat releasing portion 41b and the fins 41d are subjected to cooling. Meanwhile, the fan 40 is fit in an L-shaped notch 31b formed at a corner of the substrate 31a. Herein, the heat pipe 41 functions in an identical manner to the heat pipe 7 according to the first embodiment.

Figure 12A:
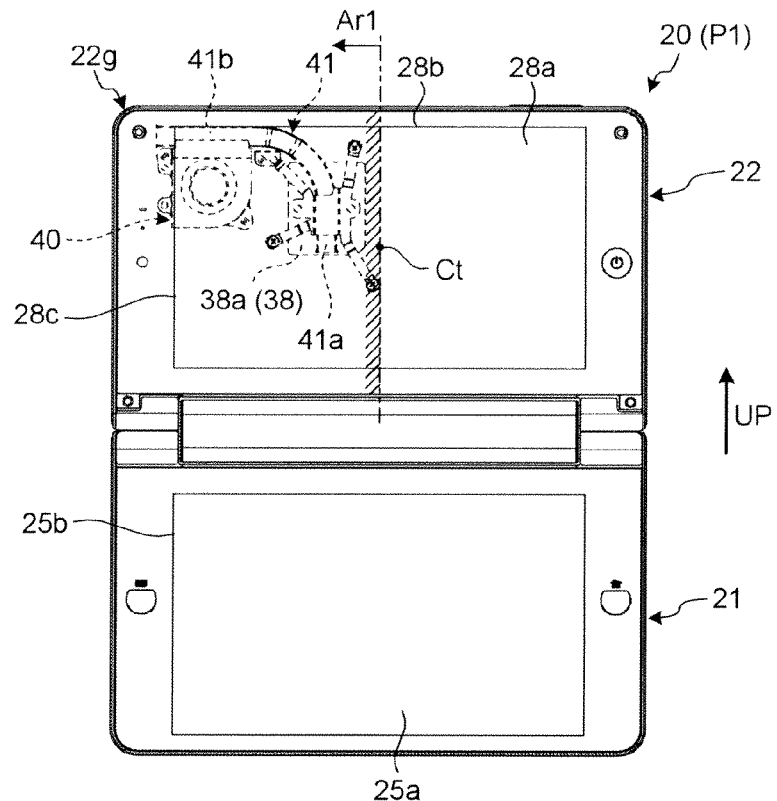
FIG. 12A is an exemplary plan view of a third orientation of the personal computer in the second embodiment.
Figure 12B:
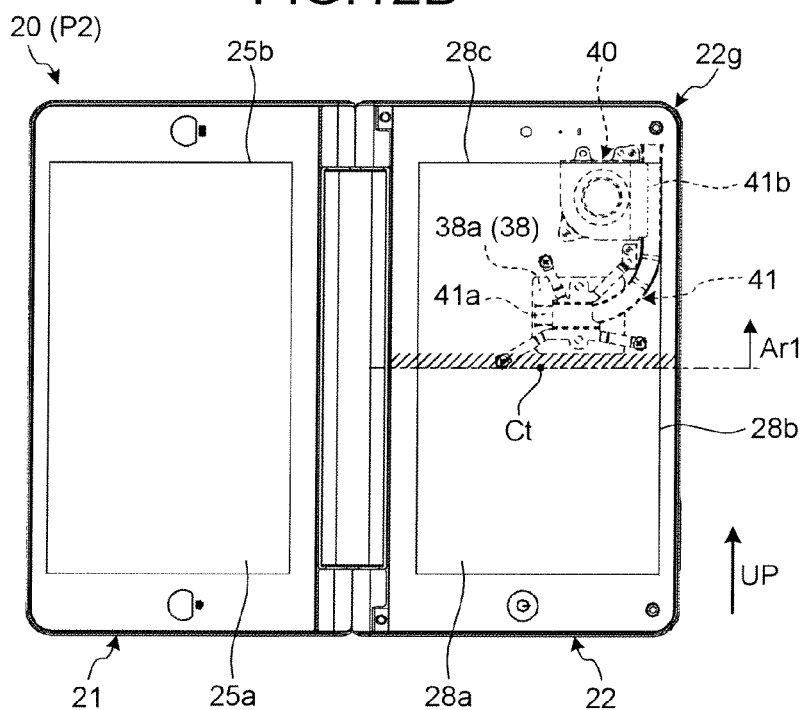
FIG. 12B is an exemplary plan view of a fourth orientation of the personal computer in the second embodiment.

As illustrated in FIG. 12, in the present embodiment too, the heat receiving portion 41a is positioned on the lower side of the heat releasing portion 41b in both of the first orientation P1 (FIG. 12A) and the second orientation P2 (FIG. 12B) in an identical manner to the first embodiment. In the heat pipe 41 functioning as the heat transport mechanism, in case the heat receiving portion 41a is positioned on the upper side of the heat releasing portion 41b thereby forming what is called a top heat condition, then the heat transport medium in the liquid state does not easily return to the heat receiving portion 41a from the heat releasing portion 41b. That causes a decline in the heat transport efficiency, that is, in the heat releasing efficiency. With regard to such a problem, in the present embodiment, the heat receiving portion 41a is positioned on the lower side of the heat releasing portion 41b in both of the first orientation P1 and the second orientation P2 that are defined to be the correct orientations. Hence, it becomes possible to prevent the heat transport efficiency, that is, the heat releasing efficiency from declining, which may happen if the heat receiving portion 41a is positioned on the upper side of the heat releasing portion 41b. Meanwhile, in order to notify the user about the first orientation P1 and the second orientation P2, the control module refers to the detection result of an orientation sensor (not illustrated) disposed inside the housing 22a of the second main body 22 and accordingly displays pictures corresponding to the first orientation P1 and pictures corresponding to the second orientation P2 on the display screens 25a and 28a. Moreover, at least on one of the first main body 21 and the second main body 22, an orientation notifying element such as a rough portion or a display element can be disposed for the purpose of notifying the user about the first orientation P1 and the second orientation P2.

Moreover, as illustrated in FIGS. 6, 7, and 12; in the present embodiment too, the heat releasing portion 41b is disposed at a corner 22g that lies at the upper end of the housing 22a in both of the first orientation P1 and the second orientation P2. Since the heat is prone to rise inside the housing 22a due to the air current, disposing the heat releasing portion 41b at the corner 22g that lies at the upper end of the housing 3a in both of the first orientation P1 and the second orientation P2 makes it possible to prevent heat accumulation from occurring inside the housing 22a.

Furthermore, as illustrated in FIGS. 6, 7, and 8; in the present embodiment, an exhaust outlet 22h is formed on aside wall 22i at the corner 22g of the housing 22a. Thus, the flow of air, which is generated by the fan 40 and which gets heated by passing through the heat releasing portion 41b formed at the corner 22g, is discharged more smoothly from the exhaust outlet 22h that is formed at the corner 22g of the housing 22a and that faces the heat releasing portion 41b from up close. As a result, heat accumulation is prevented from occurring inside the housing 22a.

As illustrated in FIG. 12, in the present embodiment, when viewed from the front of the display screen 28a (i.e., when viewed along the line of sight of FIG. 12), the exothermic CPU 38 is disposed in a rectangular area Ar1 that lies on the upper side of the center Ct of the second main body 22 in the second orientation P2. Hence, the ascending air current generated inside the housing 22a due to the heat of the exothermic CPU 38 or the flow of air drawn in the fan 40 travels a relatively long distance inside the housing 22a. AS a result, it becomes possible to prevent occurrence of a situation in which the electronic components disposed over a wide area inside the housing 22a are easily affected due to the heat. Moreover, if it is assumed that the exothermic CPU 38 lies at the center Ct, then there is a possibility that the heated air accumulates in the area on the opposite side of the exhaust outlet 22h with respect to the center Ct inside the housing 22a (i.e., on the opposite side of the corner 22g). With regard to that problem, in the present embodiment, in both of the first orientation P1 and the second orientation P2, the exothermic CPU 38 is disposed in the area on the side of the exhaust outlet 22h with respect to the center Ct (i.e., on the side of the corner 22g). Consequently, the heated air can be easily discharged to the outside of the housing 22a. Moreover, in the present embodiment, at the time of holding the second main body 22 with the hands H, usually the user holds with the hands H the opposite side of the rectangular area Ar1 positioned on the lower side of the center Ct in each orientation (see FIGS. 10 and 11). That is, the user happens to hold with the hands H an area that is distantly positioned from the CPU 38 or the heat pipe 41. Therefore, the user is spared from holding with the hands H that area of the housing 22a which becomes warm due to the heat from the CPU 38 or the heat pipe 41. Thus, while holding the personal computer 20 with the hands H, the user is spared from experiencing any sense of discomfort that may occur due to the warming of the housing 22a.

Moreover, in the present embodiment, as illustrated in FIGS. 7 and 8, air inlets 22j are formed close to the boundary Bd between the first main body 21 and the housing 22a of the second main body 22. Thus, in the present embodiment, since the air inlets 22j are distantly positioned from the exhaust outlet 22h, a wider area inside the housing 22a is subjected to cooling by airflow Stf that is let inside the housing 22a from the air inlets 22j and that flows toward the exhaust outlet 22h.

Furthermore, as illustrated in FIG. 7, the air inlets 22j formed on the outer side of the substrate 31a, that is, on the outside of an end edge 31e of the substrate 31a in the direction along the surface of the substrate 31a. As a result, the flow of air let in from the air inlets 22j gets easily distributed on the front side as well as on the rear side of the substrate 31a, so that the electronic components installed on the front side as well as on the rear side are subjected to cooling without difficulty. Meanwhile, it is also possible to form the air inlets 22j opposite to the end edge 31e of the substrate 31a. In FIG. 7, only the airflow Stf that flows on the front side of the substrate 31a is illustrated.

Figure 13:
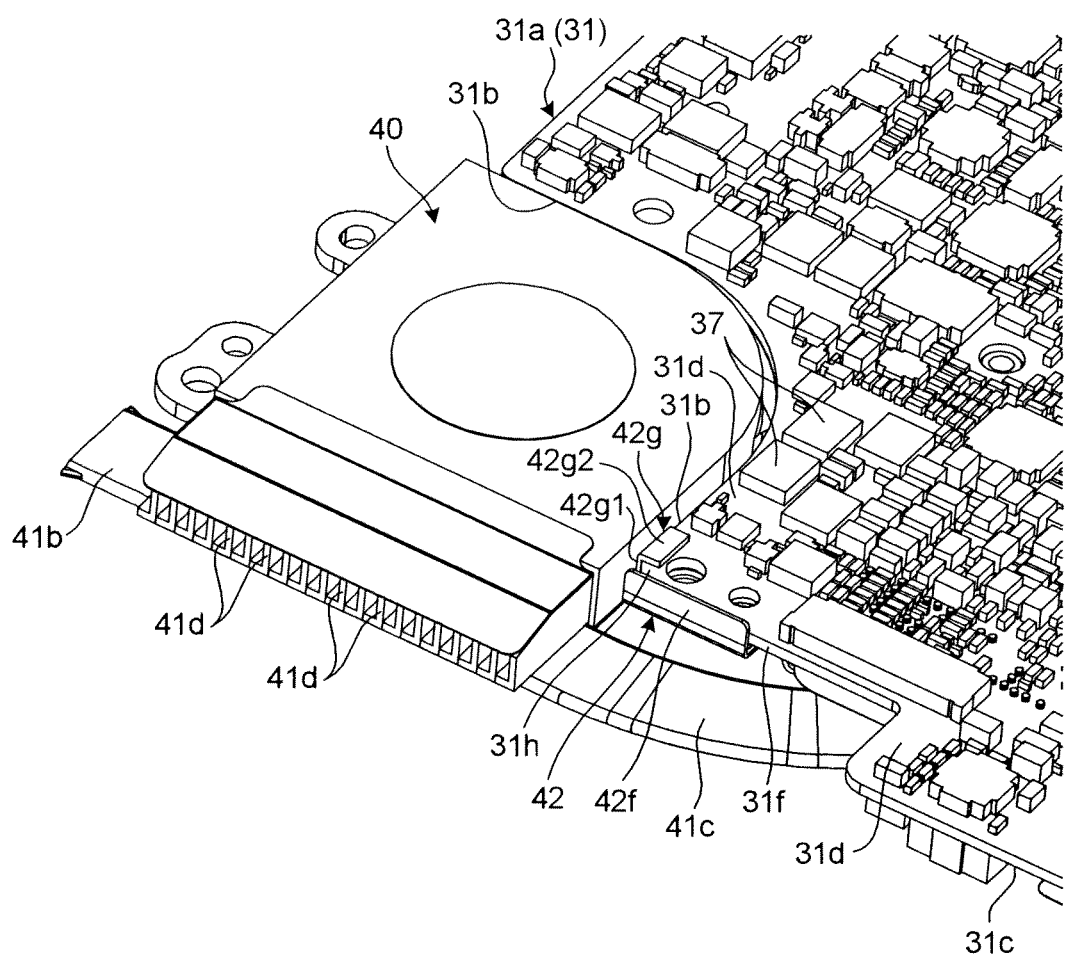
FIG. 13 is an exemplary rear perspective view of a substrate assembly comprised in the second main body of the personal computer in the second embodiment.

In the present embodiment too, as illustrated in FIGS. 6, 7, and 13; the pressing member 42 identical to the pressing member 8 in the first embodiment is fixed to the substrate 31a. The pressing member 42 comprises a pressing portion 42a, a plurality of arm portions 42b (three arm portions in the present embodiment), and a second-type arm portion 42d. The pressing portion 42a is formed into a substantially rectangular plate and is mounted above the heat releasing block 38a, which is mounted on the CPU 38, and mounted above the heat receiving portion 41a of the heat pipe 41, which is also mounted on the CPU 38. Meanwhile, each constituent element of the pressing member 42 according to the present embodiment (i.e., the pressing portion 42a, the arm portions 42b, a bracket 42c, the second-type arm portion 42d, a contact portion 42e, engaging claws 42f and 42g (see FIGS. 7 and 13), and a through hole 42h (see FIG. 7)) functions in an identical manner to the corresponding constituent element of the pressing member 8 according to the first embodiment (i.e., the pressing portion 8a, the arm portions 8b, the bracket 8c, the second-type arm portion 8d, the contact portion 8e, the engaging claws 8f and 8g, and the through hole 8h).

However, in the present embodiment, in an identical manner to the arm portions 42b, the second-type arm portion 42d also exerts a pressing force against the pressing portion 42a. That is, the second-type arm portion 42d extends upward while extending outward from the pressing portion 42a. At the end of the second-type arm portion 42d is formed a droop portion (a vertical wall portion, not illustrated) that droops toward the front face 31c of the substrate 31a. The lower end of the droop portion is the contact portion 42e (see FIG. 7). Meanwhile, in the present embodiment, on the pressing portion 42a is formed a through hole 42i through which a pin 38b protruding from the heat releasing block 38a is inserted. The engagement of the pin 38b with the through hole 42i makes it possible to prevent misalignment of the heat releasing block 38a with respect to the pressing member 42.

As illustrated in FIG. 13, the engaging claws 42f and 42g functioning as the engaging portions get engaged in a corner 31h of the substrate 31a. The engaging claw 42f gets engaged with an edge 31f that becomes the upper side of the substrate 5a in the first orientation P1. The engaging claw 42g has a first wall portion 42g1 that gets engaged with an edge 31g that becomes the upper side of the substrate 31a in the second orientation P2, and has a second wall portion 42g2 that that gets engaged with a rear face (surface) 31d of the substrate 31a. Meanwhile, the corner 31h of the substrate 31a is formed by the mutually orthogonal edges 31f and 31g. In this way, the pressing member 42 according to the present embodiment has the functions identical to the pressing member 8 according to the first embodiment. That enables achieving the same effect as achieved in the first embodiment.

Although the invention is described with reference to the abovementioned embodiments for a complete and clear disclosure, the appended claims are not to be thus limited but are to be construed as embodying all modifications and alternative constructions that may occur to one skilled in the art that fairly fall within the basic teaching herein set forth. For example, the abovementioned embodiments are explained with reference to a television apparatus or with reference to a notebook-sized personal computer having two display screens. However, alternatively, the invention is also applicable to other electronic devices having at least a single display screen. For example, the invention is also applicable to computers (notebook-sized computers or desktop computers), personal digital assistants (PDAs), smartbooks, or cellular phones having a single display screen.

Moreover, regarding the electronic device, the housing, the exothermic component, the heat transport mechanism, the heat receiving portion, the heat releasing portion, the heat transferring portion, the portion-to-be-fixed, the heat releasing block, the pressing portion, the arm portion, and the engaging portion; the specifications (method, structure, shape, material, size, number, direction, type, arrangement, etc.) can be suitably modified.

Thus, according to an aspect of the invention, it is possible to provide a television apparatus and an electronic device in which the pressed state of components achieved by making use of the pressing member can be prevented from undergoing variation.

What is claimed is:

1. A television apparatus comprising:
   a housing;
   a display device housed in the housing;
   a supporting member configured to support the housing;
   a substrate housed in the housing and having an exothermic component mounted thereon;
   a heat receiving portion thermally linked to the exothermic component; and
   a pressing member fixed to the substrate, the pressing member comprising a pressing portion configured to press the heat receiving portion to contact the exothermic component, and a hook configured to hook from an opposite side of the supporting member into an edge of the substrate, the pressing member overlapping at least a part of the exothermic component in a direction substantially perpendicular to the substrate.

2. The television apparatus of claim 1, wherein the display device can be used in a first position in which a side along a longitudinal direction of the display device is positioned on an upper side and can be used in a second position in which another side along a lateral direction of the display device is positioned on the upper side.

3. The television apparatus of claim 2, wherein the edge of the substrate comprises a first edge of the substrate which is positioned on the upper side when the display device is in the first position and a second edge of the substrate which is positioned on the upper side when the display device is in the second position, and the hook comprises a first hooking portion configured to hook into the first edge of the substrate and a second hooking portion configured to hook into the second edge of the substrate at a corner composed of the first edge and the second edge of the substrate.

4. An electronic device comprising:
   a housing in which a display device is housed;
   a substrate housed in the housing and having a first component mounted thereon;
   a second component thermally coupled to the first component; and
   a pressing member comprising a hook configured to hook into an edge of the substrate, the pressing member being configured to press the second component to contact the first component, the pressing member overlapping at least a part of the first component in a direction substantially perpendicular to the substrate.

5. The electronic device of claim 4, wherein the display device can be used in a first position in which a side along a longitudinal direction of the display device is positioned on an upper side and can be used in a second position in which another side along a lateral direction of the display device is positioned on the upper side.

6. The electronic device of claim 5, wherein the edge of the substrate comprises a first edge of the substrate which is positioned on the upper side when the display device is in the first position and a second edge of the substrate which is positioned on the upper side when the display device is in the second position, and the hook comprises a first hooking portion configured to hook into the first edge of the substrate and a second hooking portion configured to hook into the second edge of the substrate at a corner composed of the first edge and the second edge of the substrate.

7. The electronic device of claim 4, wherein the hook is disposed at an end of an arm portion extending from the pressing member.

8. The electronic device of claim 4, wherein the pressing member comprises a first arm portion comprising the hook and a second arm portion fixed to the substrate.

9. The electronic device of claim 4, wherein the hook is configured to reach a first surface on which the first component is mounted of the substrate and a second surface opposite to the first surface.

10. The electronic device of claim 4, wherein the hook is fixed to the substrate by a screw.

11. An electronic device comprising:
a housing;
a substrate situated in the housing, the substrate including a first component mounted thereon;
a second component thermally coupled to the first component; and
a pressing member comprising a wall portion configured to attach into an edge of the substrate, the pressing member being configured to press the second component to contact the first component, the pressing member overlapping at least a part of the first component in a direction substantially perpendicular to the substrate.

12. The electronic device of claim 11 further comprising a display device situated in a first position in which a side along a longitudinal direction of the display device is positioned on an upper side of the substrate.

13. The electronic device of claim 12 further comprising a display device capable of being situated in a second position in which a side along a lateral direction of the display device is positioned on the upper side of the substrate.

14. The electronic device of claim 13, wherein the edge of the substrate comprises a first edge which is positioned on the upper side of the substrate when the display device is in the first position and a second edge which is positioned on the upper side when the display device is in the second position, and the wall portion comprises a first hooking portion configured to hook into the first edge of the substrate and a second hooking portion configured to hook into the second edge of the substrate at a corner composed of the first edge and the second edge of the substrate.

15. The electronic device of claim 11, wherein the wall portion is disposed at a fore end of an arm portion extending from the pressing member.

16. The electronic device of claim 11, wherein the pressing member comprises a first arm portion comprising the wall portion and a second arm portion fixed to the substrate.

17. The electronic device of claim 11, wherein the wall portion is configured to reach a first surface on which the first component is mounted of the substrate and a second surface opposite to the first surface.

18. The electronic device of claim 11, wherein the wall portion is fixed to the substrate by a screw.

* * * * *